(12) United States Patent
Kimata (10) Patent No.: US 8,915,695 B2
(45) Date of Patent: Dec. 23, 2014

(54) CONVEYING SYSTEM HAVING ENDLESS DRIVE MEDIUM AND METHOD FOR DELIVERING/RECEIVING ARTICLE THEREIN

(75) Inventor: Tomoya Kimata, Inuyama (JP)

(73) Assignee: Murata Machinery, Ltd, Kyoto (JP)

( * ) Notice: Subject to any disclaimer, the term of this patent is extended or adjusted under 35 U.S.C. 154(b) by 161 days.

(21) Appl. No.: 13/322,589

(22) PCT Filed: Jun. 2, 2009

(86) PCT No.: PCT/JP2009/060073
§ 371 (c)(1),
(2), (4) Date: Nov. 28, 2011

(87) PCT Pub. No.: WO2010/140218
PCT Pub. Date: Dec. 9, 2010

(65) Prior Publication Data
US 2012/0070260 A1    Mar. 22, 2012

(51) Int. Cl.
*B65G 47/90*    (2006.01)
*B65G 37/02*    (2006.01)
*H01L 21/677*   (2006.01)
*B65G 47/61*    (2006.01)

(52) U.S. Cl.
CPC .......... *B65G 37/02* (2013.01); *H01L 21/67727* (2013.01); *H01L 21/67736* (2013.01); *B65G 47/61* (2013.01); *B65G 2201/0297* (2013.01)
USPC .................... 414/749.1; 198/465.4

(58) Field of Classification Search
CPC . B65G 37/02; B65G 47/61; B65G 2201/0297
USPC ................. 414/749.1, 217, 940, 222.02, 626; 198/465.1, 463.2, 463.3, 464.4, 465.4, 198/577, 468.6, 346.1, 346.2, 346.3, 412
See application file for complete search history.

(56) References Cited

U.S. PATENT DOCUMENTS

| 4,589,184 A | 5/1986 | Asano et al. |
| 4,805,759 A | 2/1989 | Rochet et al. |

(Continued)

FOREIGN PATENT DOCUMENTS

| JP | 61-150878 A | 7/1986 |
| JP | 62-502503 A | 9/1987 |

(Continued)

OTHER PUBLICATIONS

Official Communication issued in International Patent Application No. PCT/JP2009/060073, mailed on Jul. 21, 2009.

(Continued)

*Primary Examiner* — Gene Crawford
*Assistant Examiner* — Thomas Randazzo
(74) *Attorney, Agent, or Firm* — Keating & Bennett, LLP (57) ABSTRACT

In a transport system, carriers are attached to an endless belt configured to rotate in a circulating manner. At a station, a hand, a driver configured to move the hand in a rotation direction and a vertical direction, a moving distance sensor configured to measure a moving distance of the endless belt, a carrier sensor configured to detect one of the carriers at a position upstream of the hand along the rotation direction, and a signal processor configured to operate the hand are provided. To load an article, when the moving distance from a time point of detection of the carrier by the carrier sensor reaches a first moving distance, the hand is activated at a first acceleration, and to unload an article, when the moving distance from the time point of detection of the carrier by the carrier sensor reaches a second moving distance which is larger than the first moving distance, the hand is activated at a second acceleration which is larger than the first acceleration. The delay in signal processing after detection of the carrier does not affect control, and both of loading and unloading can be performed in substantially the same area.

4 Claims, 9 Drawing Sheets

(56) References Cited

U.S. PATENT DOCUMENTS

| | | | |
|---|---|---|---|
| 5,024,569 A * | 6/1991 | Watts et al. | 414/790.3 |
| 5,984,607 A * | 11/1999 | Oosawa et al. | 414/222.06 |
| 6,609,611 B1 * | 8/2003 | Lenhardt | 198/836.3 |
| 7,234,584 B2 * | 6/2007 | Rice et al. | 198/465.1 |
| 7,407,363 B2 * | 8/2008 | Okuno | 414/806 |
| 8,485,343 B2 * | 7/2013 | Kimata | 198/465.4 |
| 2004/0062633 A1 | 4/2004 | Rice et al. | |
| 2007/0059145 A1 * | 3/2007 | Rice et al. | 414/626 |
| 2008/0187419 A1 * | 8/2008 | Rice et al. | 414/222.02 |
| 2008/0289932 A1 * | 11/2008 | Rice et al. | 198/465.1 |
| 2010/0243406 A1 * | 9/2010 | Mersnik | 198/412 |

FOREIGN PATENT DOCUMENTS

| | | |
|---|---|---|
| JP | 02-023109 A | 1/1990 |
| JP | 05-008854 A | 1/1993 |
| JP | 2004-134765 A | 4/2004 |

OTHER PUBLICATIONS

Kimata, "Conveying System Having Endless Drive Medium and Conveying Method", U.S. Appl. No. 13/322,644, filed Nov. 28, 2011.

Kimata, "Conveying System Having Endless Drive Medium, Method for Identifying Carrier Thereof, and Carrier", U.S. Appl. No. 13/322,591, filed Nov. 28, 2011.

* cited by examiner

CONVEYING SYSTEM HAVING ENDLESS DRIVE MEDIUM AND METHOD FOR DELIVERING/RECEIVING ARTICLE THEREIN

BACKGROUND OF THE INVENTION

1. Field of the Invention

The present invention relates to a transport system for transporting semiconductor substrates or the like by a carrier attached to an endless driving medium. In particular, the present invention relates to a technique of allowing a carrier configured to carry articles such as semiconductor substrates or the like to load the articles from, or unload the articles to a hand of a station.

2. Description of the Related Art

According to the disclosure of U.S. Pat. No. 7,234,584, a plurality of carriers are attached to an endless belt, and the endless belt rotates in a circulating manner. Each of the carriers has a support surface for supporting a flange or the like of a semiconductor cassette, and the semiconductor cassette is loaded or unloaded using a hand of a station. Further, a sensor for detecting the carriers and an encoder for measuring a moving distance of the belt are provided to control the hand. In U.S. Pat. No. 7,234,584, the hand is activated immediately after detection of the carrier by the sensor. Therefore, the hand is activated at the same time during both of loading and unloading. However, if the hand is activated immediately after detection of the carrier, the delay in the signal processing appears as a control delay.

SUMMARY OF THE INVENTION

Preferred embodiments of the present invention make it possible to activate a hand without being affected by any delay in signal processing after detection of a carrier, and make it possible to load and unload articles in substantially the same area.

In addition, preferred embodiments of the present invention check the validity of a moving distance sensor immediately before unloading or loading of articles.

Also, preferred embodiments of the present invention use substantially the same area to elevate or lower a hand as a critical transfer area, during both loading and unloading of articles.

A transport system according to a preferred embodiment of the present invention includes an endless driving medium configured to rotate in a circulating manner; a plurality of carriers attached to the endless driving medium, and configured to hold articles for transportation; a plurality of stations provided along the endless driving medium; and a moving distance sensor configured to measure moving distance of the endless driving medium.

In a preferred embodiment of the present invention, each of the plurality of stations includes a hand configured to load articles to or unload articles from the carriers; a driver configured to move the hand in a rotation direction of the endless driving medium, and move the hand in a vertical direction; a first carrier sensor configured to detect the carrier at a predetermined position upstream of the hand along the rotation direction of the endless driving medium; and a signal processor configured to activate the hand via the driver based on a moving distance measured by the moving distance sensor, from a time point of detection of the carrier by the first carrier sensor.

To load an article from the hand to the carrier, when the moving distance reaches a first moving distance, the signal processor activates the hand at a first acceleration via the driver, and to unload an article from the carrier to the hand, when the moving distance reaches a second moving distance which is larger than the first moving distance, the signal processor activates the hand at a second acceleration which is larger than the first acceleration.

For example, the moving distance sensor is provided in each of the stations. Alternatively, the moving distance sensor may be provided in any of a plurality of stations positioned close to one another so that the moving distance sensor can be shared by the stations positioned close to one another. Alternatively, the moving distance sensor may be provided at an intermediate position between adjacent stations so that the moving distance sensor can be shared by the left and right stations.

A method of loading and unloading articles in a transport system according to a preferred embodiment of the present invention includes the steps of attaching a plurality of carriers to an endless driving medium to hold articles by the carriers for transportation; rotating the carriers in a circulating manner; and providing a moving distance sensor configured to measure a moving distance of the endless driving medium.

Further, at each of a plurality of stations provided along the endless driving medium, the method includes the steps of providing a hand configured to load articles to or unload articles from the carriers; providing a driver configured to move the hand in a rotation direction of the endless driving medium, and rotate the hand in a vertical direction; providing a first carrier sensor configured to detect the carrier at a predetermined position upstream of the hand along the rotation direction of the endless driving medium; and providing a signal processor configured to operate the hand based on a signal from the first carrier sensor.

To load an article from the hand to the carrier, when the moving distance measured by the moving distance sensor, from a time point of detection of the carrier by the first carrier sensor, reaches a first moving distance, the signal processor activates the hand via the driver at a first acceleration, and to unload an article from the carrier to the hand, when the moving distance measured by the moving distance sensor, from a time point of detection of the carrier by the first carrier sensor, reaches a second moving distance which is larger than the first moving distance, the signal processor activates the hand via the driver at a second acceleration which is larger than the first acceleration.

Preferably, each of the stations further includes a second carrier sensor. The second carrier sensor is provided on the downstream side of the first carrier sensor in the rotation direction of the endless driving medium, and on the downstream side of the first carrier sensor by a distance which is larger than the second moving distance.

When the second carrier sensor detects the carrier, the signal processor compares the moving distance from a time point of detection of the carrier by the first carrier sensor measured by the moving distance sensor with the distance larger than the second moving distance, and if a difference between the moving distance and the distance larger than the second moving distance is greater than a predetermined value, the signal processor stops movement of the hand via the driver.

Preferably, when the moving distance measured by the moving distance sensor from a time point of detection of the carrier by the second carrier sensor reaches a third moving distance common to both of a case of loading the article from the hand to the carrier and a case of unloading the article from the carrier to the hand, the signal processor starts an elevating motion or a lowering motion of the hand via the driver.

In this specification, the description regarding the transport system is directly applicable to the transport method according to various preferred embodiments of the present invention.

In various preferred embodiments of the present invention, after waiting for movement (moving distance) of the endless belt by the first moving distance or the second moving distance from a time point of detection of the carrier by the first sensor, the hand is activated. Therefore, the delay in signal processing after detection of the carrier does not cause any delay in activation of the hand. In the case of loading the article from the hand to the carrier, the acceleration at the time of activating the hand is small. In the case of unloading the article from the carrier to the hand, acceleration at the time of activating the hand is large. Therefore, by activating the hand after a small moving distance from detection of the carrier in the case of loading and activating the hand after a large moving distance from detection of the carrier in the case of unloading, substantially the same area can be used for both of loading and unloading of articles. Thus, the travel stroke of the hand can be shortened. Further, while the area for loading or unloading of the articles requires accurate travel control, such an area requiring accurate travel control can be shortened. If the travel stroke is shortened, the time used for one loading or one unloading is shortened. As a result, loading or unloading of articles can be performed a larger number of times. Further, the position of the carrier after detection by the first carrier sensor can be determined using the moving distance sensor. Thus, the area where the hand can be synchronized with the carrier is widened even if the velocity of the endless driving medium changes.

Preferably, at a position after activation of the hand, the carrier is detected again by the second carrier sensor, and an error (difference) in the measurement result of the moving distance of the endless driving medium at this time point is measured. In this manner, validity of the moving distance sensor can be checked immediately before elevating or lowering of the hand is performed. If there is a large error in the moving distance sensor, loading or unloading can be cancelled.

Further, by starting the elevating motion or lowering motion of the hand for loading or unloading based on a common moving distance from the time point when the carrier is detected by the second carrier sensor, substantially the same area can be used for both of the elevating motion and the lowering motion of the hand that are important motions.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described.

FIGS. 1 to 11 show preferred embodiments and modifications thereto. In the drawings, a reference numeral 2 denotes a transport system that rotates an endless belt 4 in a circulating manner. Reference numerals 6 denote pulleys to drive the endless belt 4. Reference numerals 6a, 6b denote individual pulley parts. Instead of the belt 4, a chain, a wire, a rope or other suitable device may be used, for example. The belt 4 is rotated in a fixed direction, and a plurality of stations 8 are provided along the belt 4. Buffers (not shown) and processing tools 10 or the like are preferably connected to each station 8. For example, carriers 12 are attached to the belt 4 at constant intervals for transportation of cassettes 14 containing semiconductor substrates or other suitable articles. Any type of articles can be transported.

Figure 1:
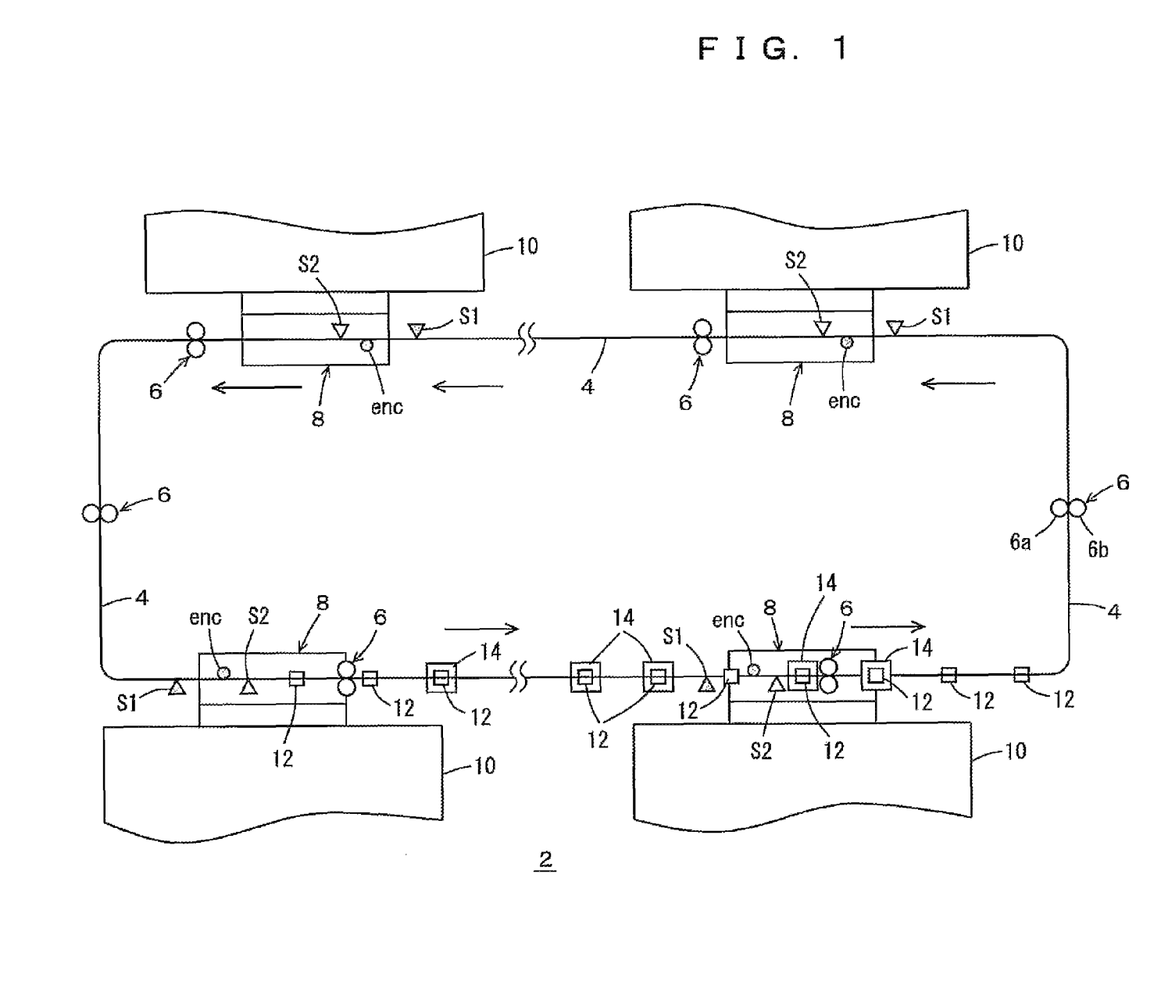
FIG. 1 is a plan view showing a layout of a transport system according to a preferred embodiment of the present invention.
Figure 2:
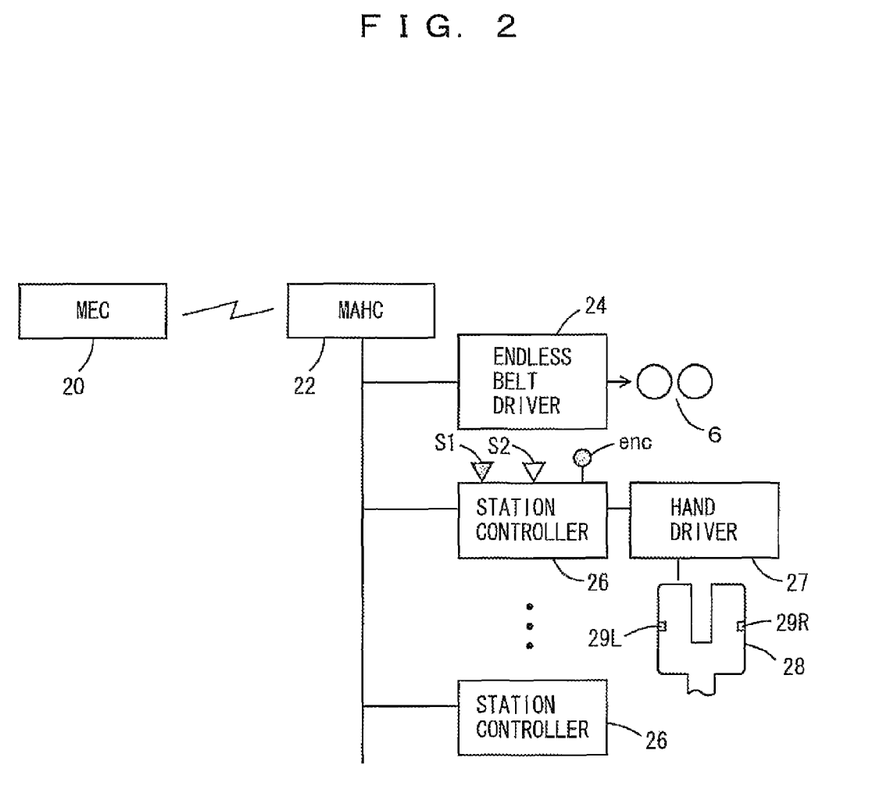
FIG. 2 is a block diagram showing a control system included in a preferred embodiment of the present invention.

FIG. 2 shows a control system of the transport system. A reference numeral 20 denotes a manufacturing execution controller. The manufacturing execution controller 20 controls processing tools or the like, and requests a material handling controller 22 to transport the cassettes. The material handling controller 22 controls an endless belt driver 24 and station controllers 26. The station controller 26 is preferably provided for each station. The endless belt driver 24 preferably drives the endless belt 4 at a constant velocity, for example. Inputs to the station controller 26 are transportation instructions from the material handling controller 22. The transportation instructions are issued to load cassettes from, or unload cassettes to a carrier at a predetermined address. A unique address is assigned to each of the carriers along a rotation direction in which the endless belt is rotated. In the present preferred embodiment, the address includes data having a bit length in a range of 10 to 16 bits, and the address is expressed using a binary value, for example. Loading is a motion to allow the carrier to support the articles, and unloading is a motion to take out the articles from the carrier using a hand.

Detection signals indicating detection of carriers are inputted from two photoelectric sensors s1, s2, to the station controller 26. Among the photoelectric sensors s1, s2, the photoelectric sensor s1 additionally inputs identification signals indicating identification of the carriers to the station controller 26. The travel moving distance of the endless belt is inputted from an encoder enc to the station controller 26. The station controller 26 recognizes an appearance of a carrier at a predetermined position upstream of the station by the signal from the photoelectric sensor s1, and recognizes a type of the carrier, e.g., based on the duration of the signal detected by the photoelectric sensor s1.

The data of the encoder when the carrier is detected by the photoelectric sensor s1 is latched. The difference between the latch value is considered, and the position of watching the photoelectric sensor s1 is regarded as a reference point to recognize the position of the carrier. Further, validity or the like of the data of the encoder is checked by the photoelectric sensor s2 as described later. Based on the data of the encoder, a hand driver 27 is operated, and a hand 28 provided at the station is operated to load cassettes from, and unload cassettes to the carrier. At the time of loading a cassette, the hand 28 holding the cassette is activated, and at the time of unloading a cassette, the hand 28 that does not hold any cassettes is activated. For this purpose, acceleration of the hand 28 at the time of unloading may be higher than acceleration of accelerating the hand 28 at the time of loading. In this case, the position of activating the hand 28 at the time of unloading is downstream of the position of activating the hand 28 at the time of loading.

A dedicated hand for loading and a dedicated hand for unloading may be used. Alternatively, one hand may be used for both loading and unloading. The hand 28 is a final effective element of a transfer system, and any shape and structure can be adopted for the hand 28. For example, occupation sensors 29R, 29L may preferably be provided on both of left and right sides of the hand 28. In the case of loading a cassette on a carrier, it is checked whether the carrier supports another cassette or not. In the case of unloading a cassette from a carrier, it is checked whether any cassettes are loaded on the carrier or not. The hand and the endless belt preferably move at the same velocity. Since the hand 28 moves toward the carrier from a position on the front side of the carrier or from a position on the back side of the carrier, a pair of left and right occupation sensors 29R, 29L are used selectively depending on the direction in which the hand 28 moves toward the carrier.

Figure 3:
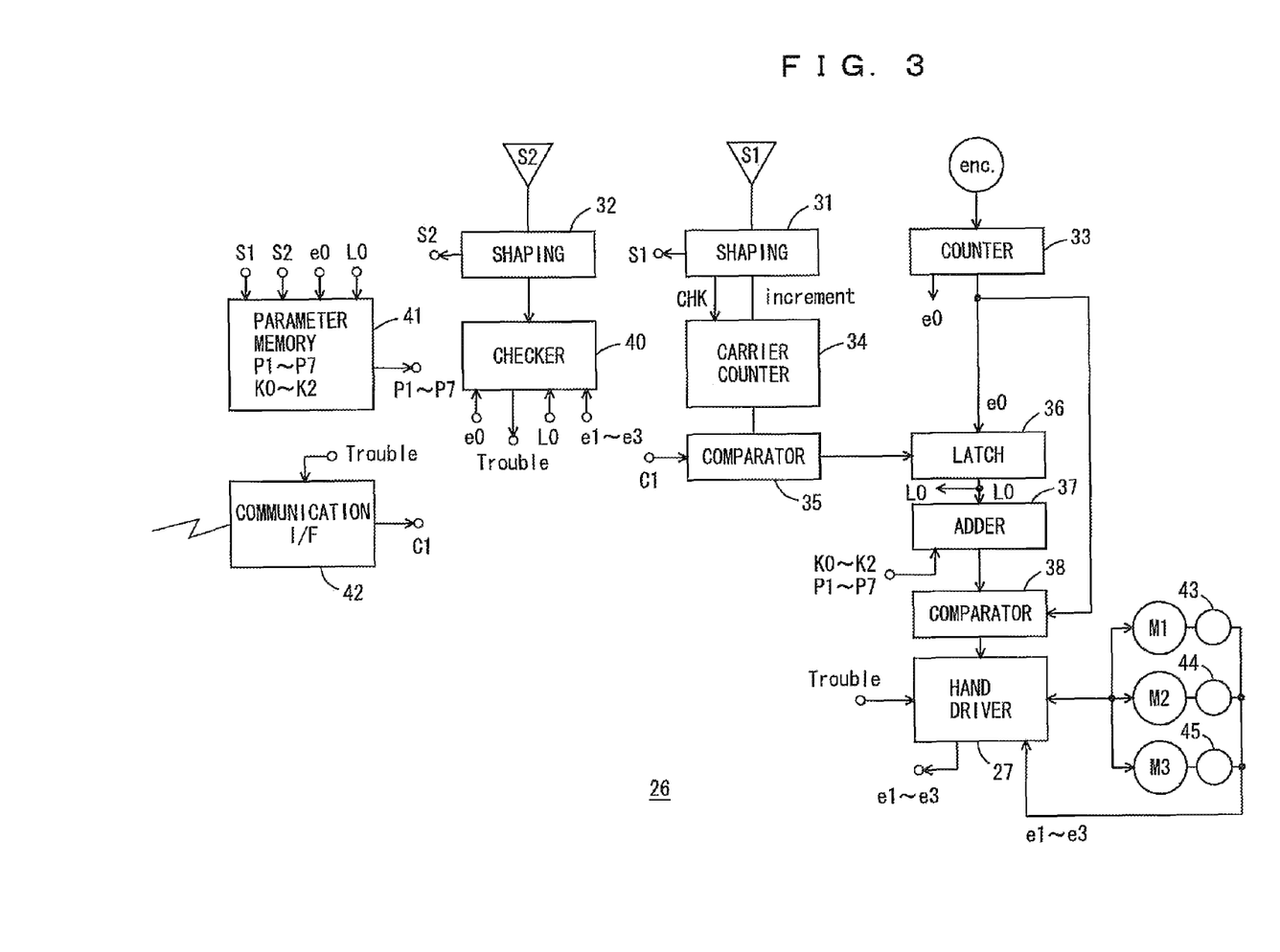
FIG. 3 is a block diagram showing a control system of a station according to a preferred embodiment of the present invention.

FIG. 3 shows structure of the station controller 26. Reference numerals 31, 32 denote shaping circuits. Shaping of signals from the sensors s1, s2 is performed, and a counter 33 counts the output pulses from the encoder. A reference numeral e0 denotes the output from the counter 33. A signal from a carrier counter 34 indicates an address of the carrier. In response to the detection signal indicating detection of the carrier from the sensor s1, the carrier counter 34 increments the carrier number by 1, and checks the validity of the value of the carrier counter 34 based on a check signal which appears at intervals of every eight sensors, for example. If there is any error in the data of the carrier counter 34 for some reason, the check signal does not match the output from the carrier counter 34.

A comparator 35 compares the address of the carrier designated to perform loading or unloading of articles and the output from the carrier counter 34. If the address of the carrier matches the output from the carrier counter 34, the output from the counter 33 at this time point is stored in a latch 36. The output from the latch 36 is denoted by L0. The output from the counter 33 at the moment when the signal of the sensor s1 is turned on is stored. In the case where processing in the carrier counter 34 and the comparator 35 is slow, processing is modified to allow the latching operation to be performed at the rising edge of the output from the shaping circuit 31. A reference numeral 37 denotes an adder that adds calibrated transfer parameters K0 to K2, P1 to P7 stored in a parameter memory 41. When the comparator 38 determines that the signal from the adder 37 matches the signal from the counter 33, the hand is operated by the hand driver 27 accordingly.

In the present preferred embodiment, the hand is preferably operated by three motors M1, M2, and M3, for example. Among these motors M1, M2, and M3, the motors M1, M2 are preferably used to elevate or lower the hand in the height direction. The motor M3 is preferably used to move the hand in the rotation direction in which the endless belt is rotated as indicated by an arrow Y. In the following description, it is assumed that height direction is a direction indicated by an arrow Z. In the present preferred embodiment, the hand is driven along two axes, i.e., in the Y direction and in the Z direction. Further, the hand may be driven additionally in a direction, e.g., indicated by an arrow X, i.e., to move along three axes. Moreover, the numbers of rotations of the motors M1 to M3 are monitored by the encoders 43 to 45, and feedback control of the hand is implemented by the signals from encoders 43 to 45. The hand driver 27 uses the output from the encoder enc on the belt side as a trigger to start respective phases of hand operations, and does not use it for feedback control. Thus, the hand can be controlled easily. The outputs from the encoders 43 to 45 are reset each time the hand returns to its home position after loading or unloading of articles is finished.

The signals from the latch 36 and the counter 33 are inputted to an encoder checker 40 to examine validity or the like of the encoder enc. That is, the interval between the detection positions of the photoelectric sensor s1 and the photoelectric sensor s2 is known, and the number of output pulses of the encoder corresponding to this interval is stored in the parameter memory 41. The validity of the encoder enc can be checked based on whether the difference between the signal from the counter 33 at the time point when the sensor s2 is operated and the output from the latch 36 corresponds to the interval between the sensors s1, s2. Further, as described later, when the sensor s2 is operated, operation of the hand is started. If the hand is operated according to a target operating pattern, the outputs from the encoders 43 to 45 at this time point must be in a predetermined range. Therefore, operation of the hand is checked based on the signals from the encoders 43 to 45 when the sensor s2 is turned on. If there is any error (difference) that is greater than a predetermined value in these items of data, a trouble signal Trouble is outputted from the checker 40, and operation of the hand is stopped.

When the photoelectric sensor s2 is turned on, velocities of the belt and the hand in the Y direction are determined based on the change in the encoder's output per unit time. Matching of these velocities is checked, and if there is an error greater than the predetermined value, operation of the hand is stopped. This processing may be omitted.

A communication interface (I/F) 42 communicates with the material handling controller 22, and an address of a carrier which requires loading or unloading of cassettes, and a type indicating loading or unloading are inputted. Then, transportation results are transmitted from the communication interface 42 to the material handling controller 22. Further, the trouble signal Trouble is outputted from the checker 40. When the transfer operation is interrupted, information to this effect is reported to the material handling controller 22.

Figure 4:
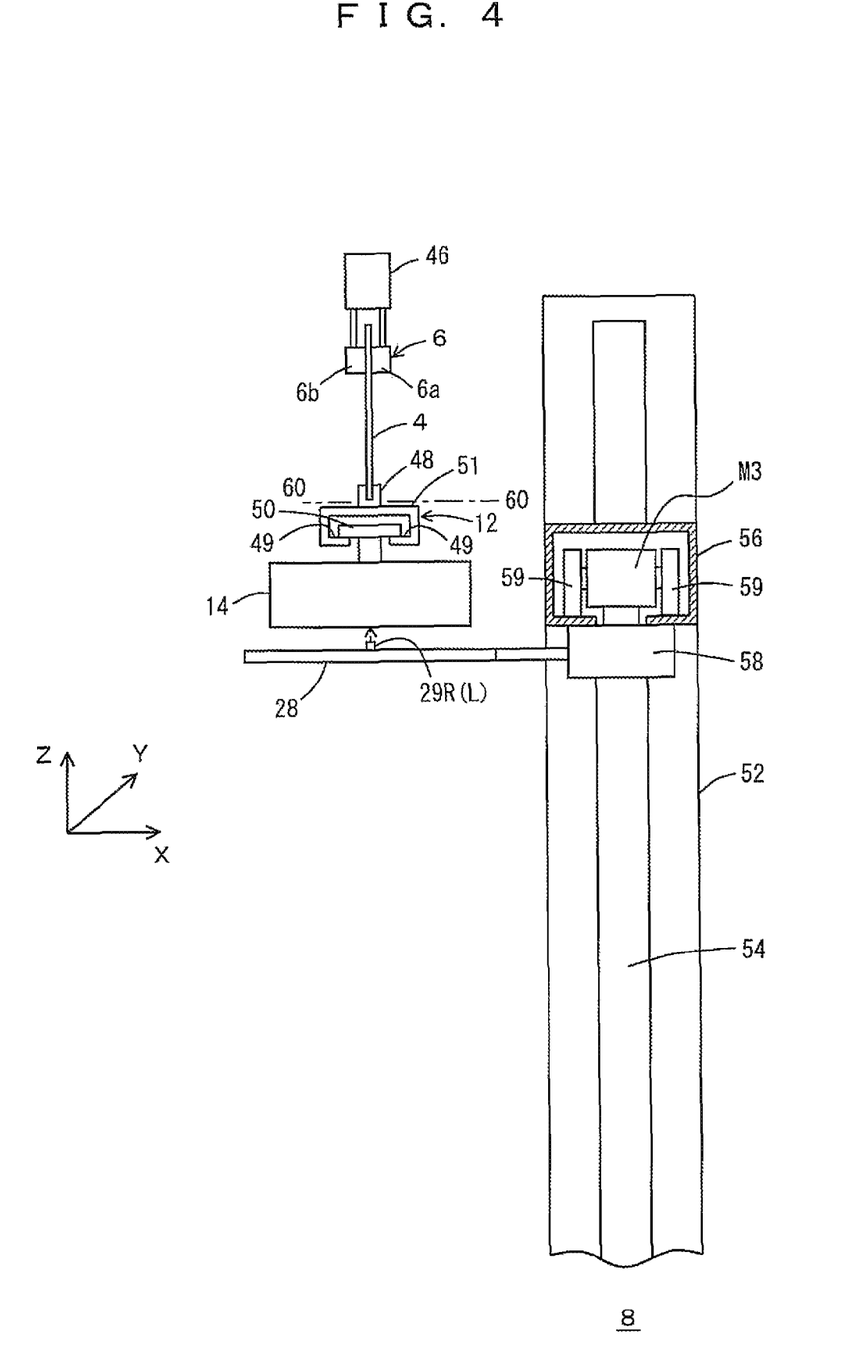
FIG. 4 is a side view showing main components of a carrier and a hand of the station included in a preferred embodiment of the present invention.
Figure 5:
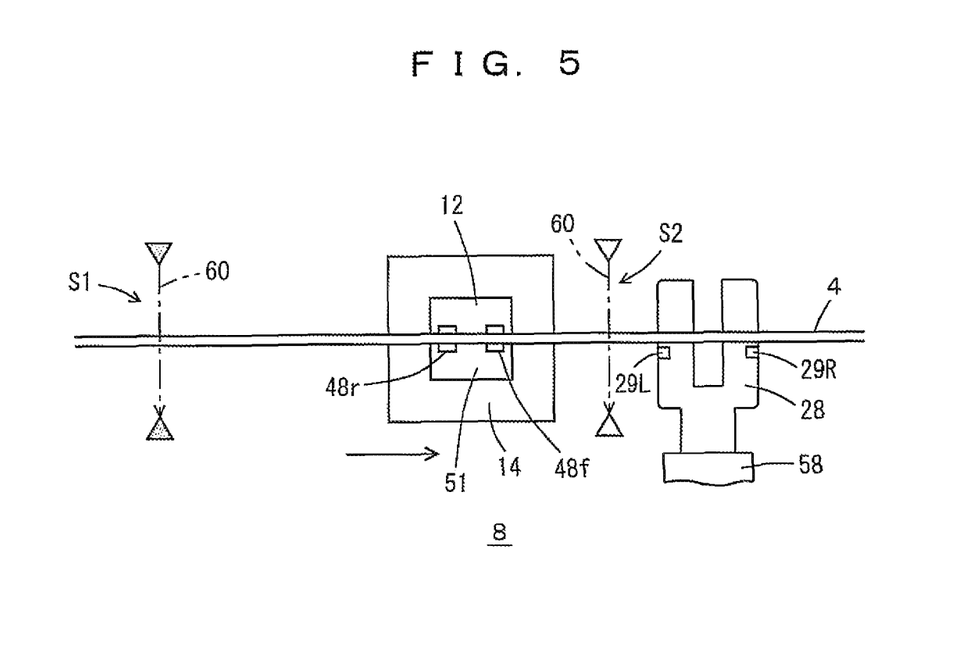
FIG. 5 is a plan view showing main components of the carrier and the hand of the station according to a preferred embodiment of the present invention.
Figure 6:
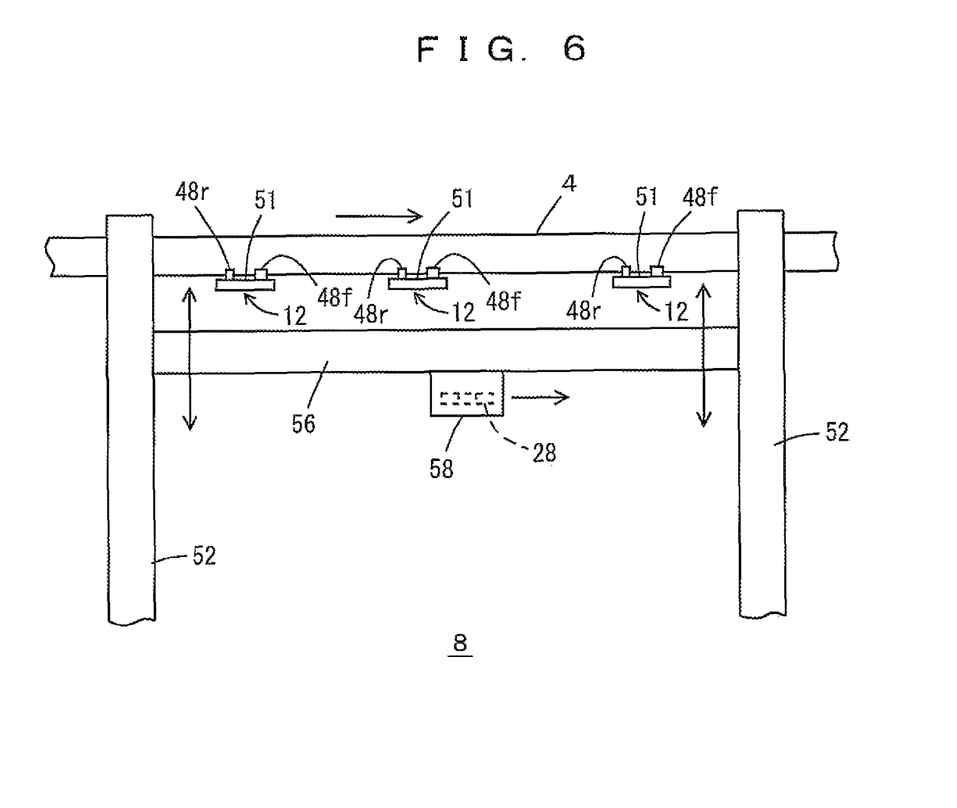
FIG. 6 is a rear view showing main components of the station included in a preferred embodiment of the present invention.

FIGS. 4 to 6 show the relationship between the hand 28 and the endless belt 4 at the station 8. As shown in FIG. 4, it is assumed that the rotation direction of the belt 4 is the Y direction, the direction perpendicular to the Y direction in a horizontal plane is the X direction, and the height direction is the Z direction. Further, the hand 28 is operated in the Y direction and the Z direction. The pulley 6 is operated by a driving motor 46 or other suitable device, for example. The carrier 12 includes a pair of front and back attachments 48.

Among the attachments 48, an attachment on the front side is denoted by a reference numeral 48f, and an attachment on the back side is denoted by a reference numeral 48r. The carrier 12 includes a carrier body 51 and the attachments 48. A gap between a lower end of the endless belt 4 and an upper end of the carrier body 51 is a watching line 60. At this height, the photoelectric sensors s1, s2 watch the attachments 48f, 48r. The flange 50 of the cassette 14 is placed on a supporting surface 49 of the carrier body 51. A pair of columns 52 are provided on both of left and right sides of the station 8. An elevating and lowering rail 56 is elevated and lowered along a guide groove 54 by motors M1, M2 (not shown). A motor M3 is provided at an upper portion of a hand base 58, and wheels 59 travel within the elevating and lowering rail 56 in the Y direction.

FIG. 5 shows the positional relationship between the photoelectric sensor s1, the hand 28 at the home position, and the photoelectric sensor s2. The encoder enc should be positioned adjacent to the station 8. The position of the encoder enc can be determined freely. The home position of the hand 28 is a position where the hand 28 stands by waiting to load the articles from, and unload the articles to the carrier 12. The endless belt 4 travels from the left side to the right side in FIG. 5. In the case of loading, when the carrier moves forward by K0 from the photoelectric sensor s1 based on the number of output pulses from the encoder, the hand 28 is activated. In the case of unloading, when the carrier moves forward from the photoelectric sensor s1 by K2 (K2>K0) based on the number of output pulses, the hand 28 is activated. The interval between the photoelectric sensors s1, s2 is equivalent to K1, in terms of output pulses, where K1> K2>K0.

Figure 7:
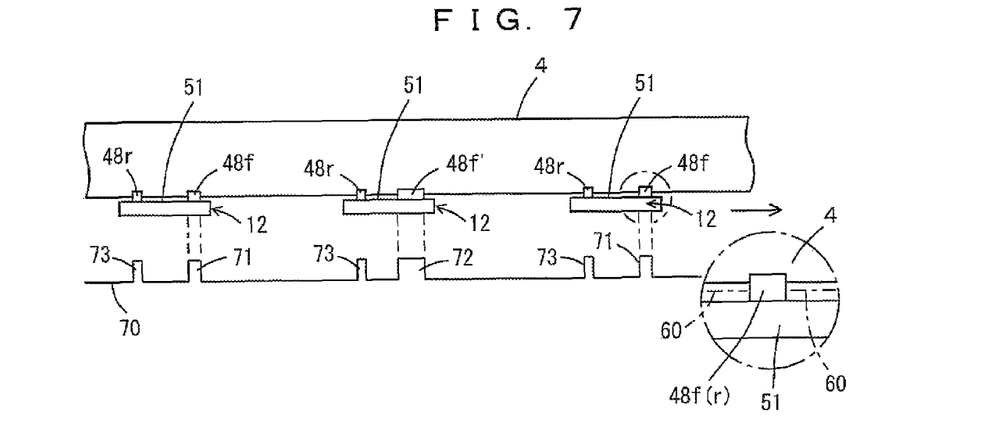
FIG. 7 is a view showing identification of a carrier in a preferred embodiment of the present invention.

FIG. 7 shows detection and identification of the carrier 12. It is assumed that the endless belt 4 travels from the left side to the right side in FIG. 7 at a constant velocity. The carrier 12 includes the attachment 48f on the front side, and the attachment 48r on the back side. The attachments 48f, 48r have different widths along the travel direction of the belt 4. Further, for example, attachments 48f' having a different width along the travel direction of the belt 4 are provided at intervals of every eight carriers. In this preferred embodiment, when the attachments 48f, 48r are detected by the photoelectric sensor s1, a signal shown on the lower side in FIG. 7 is obtained. A reference numeral 70 denotes a baseline of detection signals, and reference numerals 71 to 73 denote the detection signals. Since the attachments 48f and 48r have different widths, the signals 71, 73 have different widths. Next, since the attachments 48f and 48f' have different widths, if the signals 71, 72 have different widths, and the attachment 48f' can be detected. For example, the attachments 48f' are preferably provided at intervals of every eight carriers, the lower three bits of the address of the carrier 12 can be checked, for example. As can be seen from an enlarged view at a lower right position in FIG. 7, the watching line 60 for the attachments 48f, 48r or the like is positioned in a gap in the height direction between the lower end of the belt 4 and the carrier body 51.

FIGS. 8 to 11 show loading motion (FIG. 8) and unloading motion (FIG. 9) in the present preferred embodiment, and an algorithm used to perform the loading motion and the unloading motion. When the carrier is detected by the photoelectric sensor s1, the count value of the encoder output at this time point is latched. The latched output is denoted by a reference numeral L0. After latching, a preparation period is provided before starting operation of the hand. In the case of loading, a stand by period of K0 in terms of the number of pulses of the encoder's output is provided, and in the case of unloading, a stand by period of K2 in terms of the number of pulses is provided. Since acceleration at the time of loading is smaller than acceleration at the time of unloading, the number of pulses K0 is smaller than the number of pulses K2. As a result, a loading motion and an unloading motion as described later can be started at the same position relative to the station. Then, before turning on the photoelectric sensor s2, travel of the hand in the Y direction is started in both of loading and unloading.

At the time point when the photoelectric sensor s2 is turned on, the number of the encoder's output pulses after the photoelectric sensor s1 is turned on is determined, and this number is compared with a predetermined value K1. If the error (difference) from the predetermined value K1 is large, it is considered that sliding or the like occurs in the encoder, and transfer is stopped. Further, at the time point when the photoelectric sensor s2 is turned on, values of the encoders 43, for the driving motor of the hand are checked to confirm whether the hand is operated in accordance with a predetermined operating pattern. That is, it is determined whether the moving distance from the home position matches the position of the photoelectric sensor s2 or not, and it is determined whether moving distances of the two encoders 43, 44 are the same. Further, at this time point, the rotation velocity of the belt is determined from the encoder on the belt side, and specifically, the change per unit time in the output value of the counter 33 is determined. Likewise, the velocity in the Y direction of the hand 28 is determined to check whether it is the same as the velocity of the belt. If the difference between these values is not greater than a predetermined value, the hand and the carrier pass through the photoelectric sensor s2 at the same time and at the same velocity. Therefore, it can be confirmed that the hand is ready to be elevated.

After the photoelectric sensor s2 is turned on, at the time when a number of output pulses common to both of loading and unloading is obtained, an operation of elevating or lowering the hand is started. The phrases loading motion or unloading motion herein indicate operation from the start to the end of elevating or lowering the hand. The count value of the encoder's output pulses at the time of starting loading motion or unloading motion is larger than the latched value L0 by P1. P1 is common to both of loading and unloading. When the carrier comes to a position which is the same as the position of the station, a loading motion or an unloading motion is started. For this purpose, the area where unloading movement is performed and the area where loading movement is performed are substantially the same with respect to the station.

Figure 8:
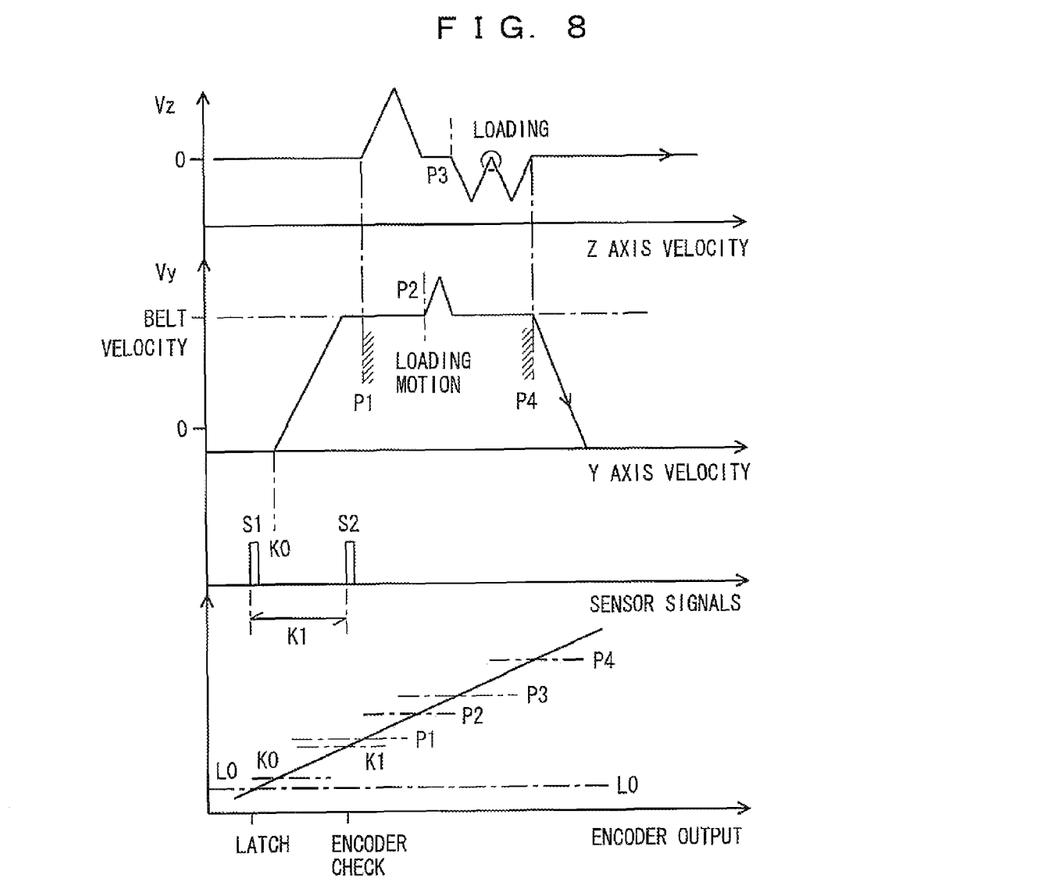
FIG. 8 is a timing chart at the time of loading in a preferred embodiment of the present invention.

In the case of loading, the hand is elevated, and when the output value from the counter is increased by P2, the hand is accelerated in the Y direction. The hand and the carrier are overlapped with each other vertically along the Y direction. When the counter value of the encoder's output becomes L0+P3, the hand is started to be lowered. While the hand is being lowered, when the velocity in the Z direction becomes 0, the cassette is loaded from the hand to the carrier. When the counter value of the encoder's output becomes L0+L4, elevating and lowering operation of the hand is stopped, and the hand is decelerated along the Y direction to escape to the back side of the carrier. When the count value becomes L0+L7, the carrier returns to a predetermined position of the station.

Figure 9:
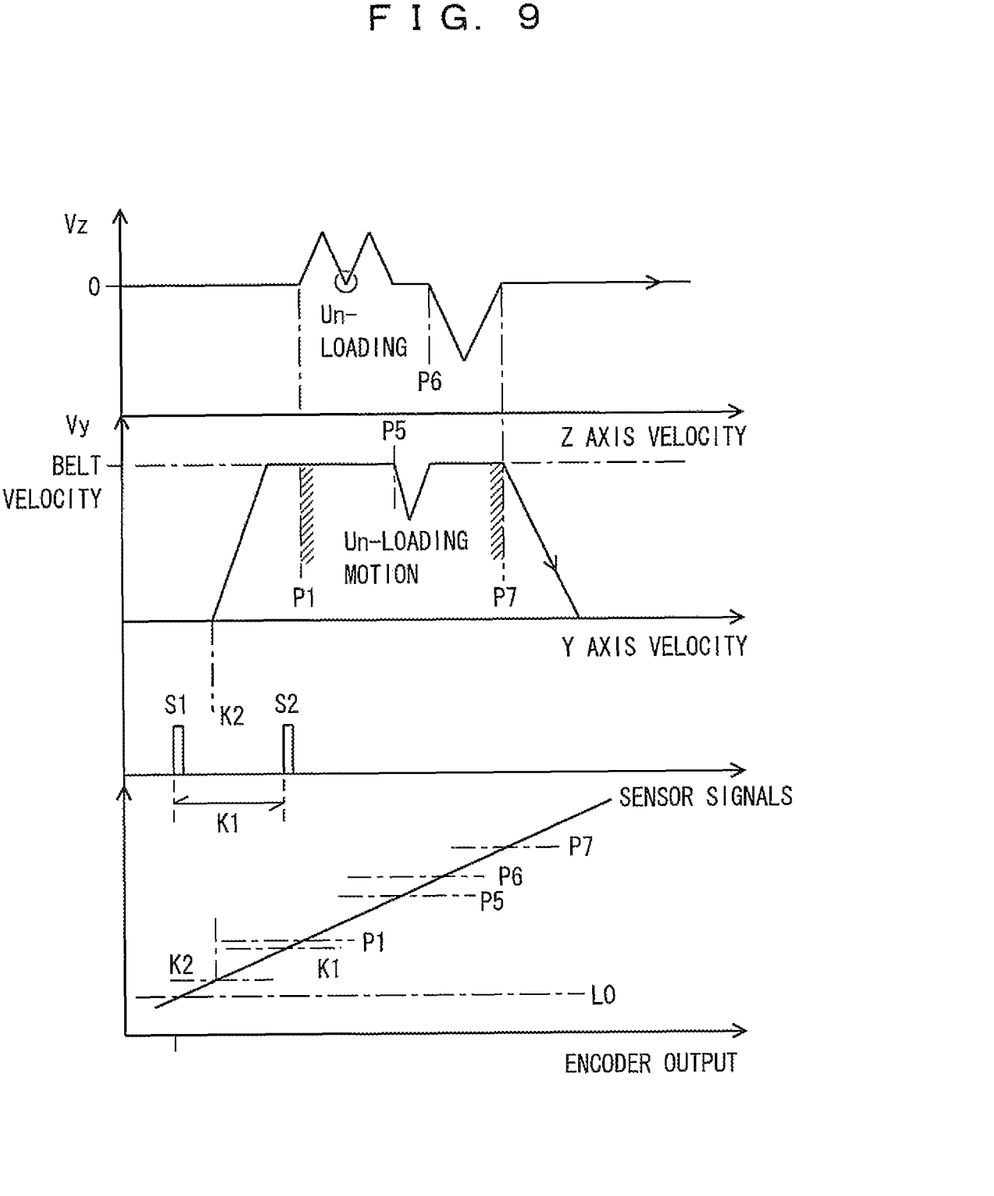
FIG. 9 is a timing chart at the time of unloading in a preferred embodiment of the present invention.
Figure 10:
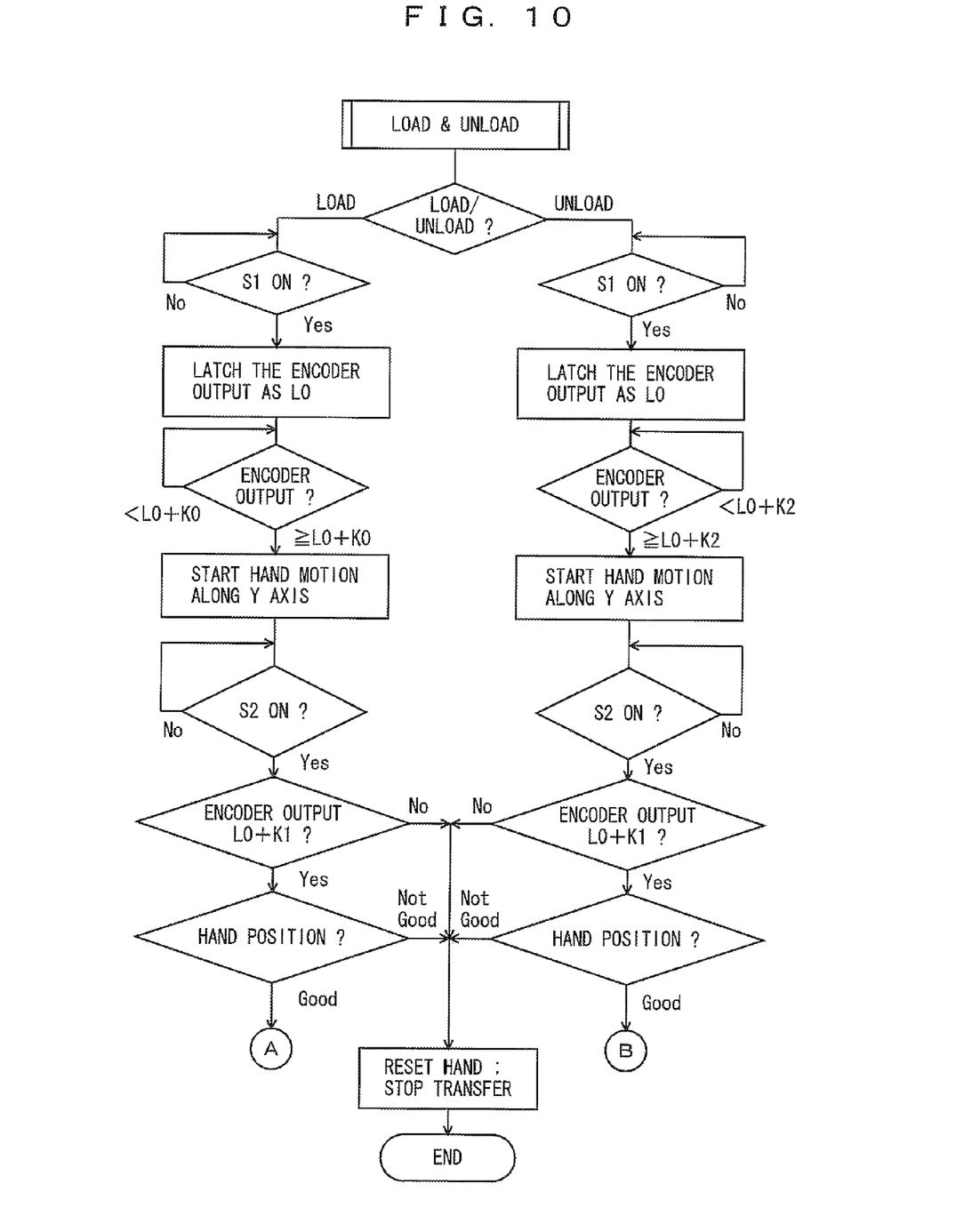
FIG. 10 is a flow chart showing the former half of an algorithm of loading and unloading in a preferred embodiment of the present invention.
Figure 11:
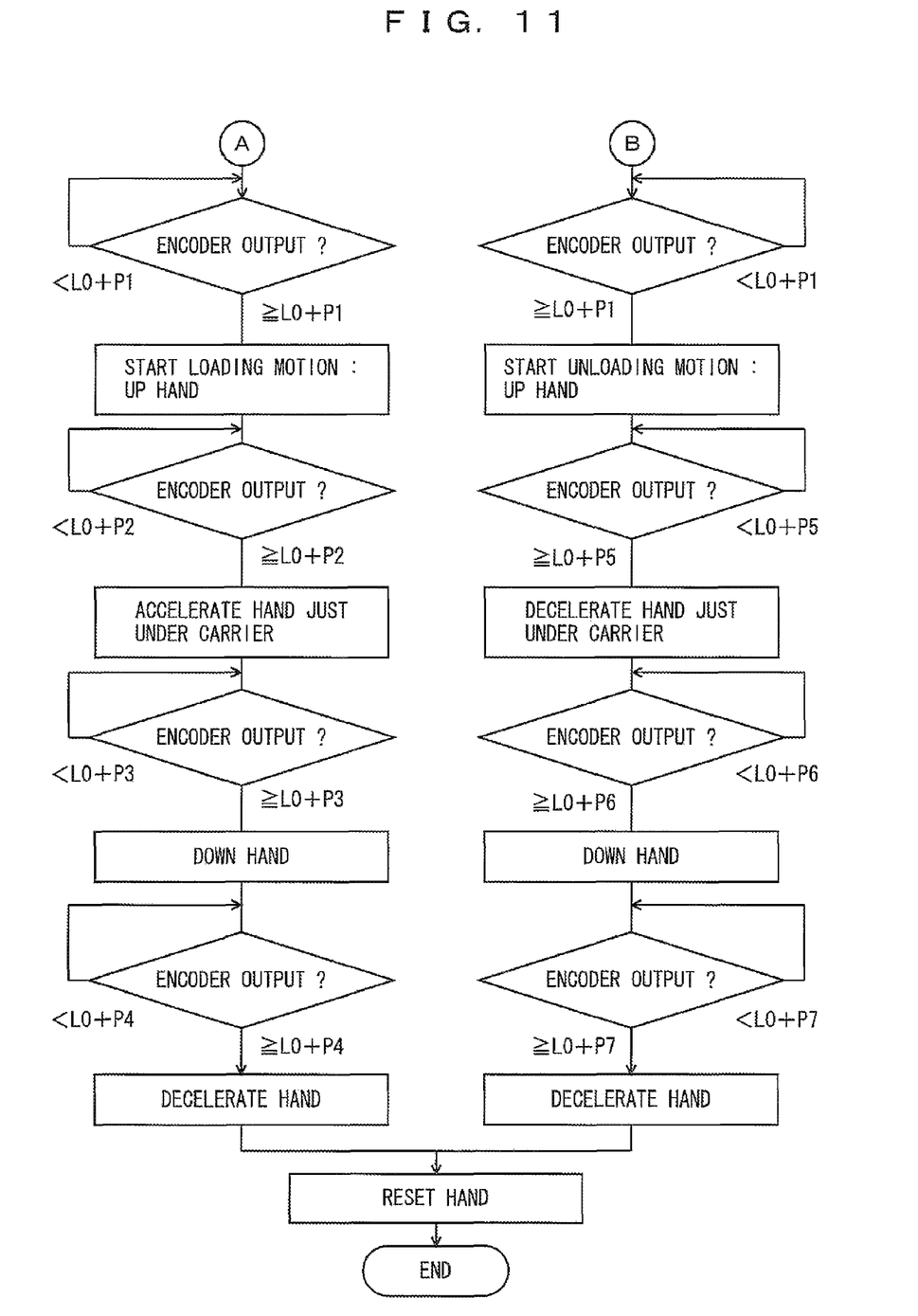
FIG. 11 is a flow chart showing the latter half of the algorithm of loading and unloading in a preferred embodiment of the present invention.

In the case of unloading, elevation of the hand is started when the counter value of the encoder's output becomes L0+L1. While the hand is being elevated, the velocity in the Z direction is once regulated to zero. At this time point, the cassette is unloaded from the carrier to the hand. Then, when the count value becomes L0+P5, the hand is decelerated to escape to the back side of the carrier, and when the count value becomes L0+L6, the hand is lowered. Then, when the counter value becomes L0+L7, the carrier returns to a predetermined position of the station.

In the present preferred embodiment, the following advantages are obtained.

After waiting for movement (moving distance) of the endless belt 4 by the first moving distance or the second moving distance from detection of the carrier by the photoelectric sensor S1, the hand 28 is activated. Therefore, the delay in signal processing after detection of the carrier does not affect activation of the hand. The hand is activated from the upstream side of the second photoelectric sensor, and thus, the hand and the carrier can pass through the second photoelectric sensor S2 at the same time and at the same velocity.

The first moving distance for loading is shorter than the second moving distance for unloading. In the case of loading, the hand is activated earlier than the case of unloading. In the case of loading, acceleration of the hand is small. However, since the hand is accelerated at an earlier stage, substantially the same area can be used for both of loading and unloading of articles. Therefore, for example, the travel stroke of the hand can be shortened, or the area which requires accurate travel control can be shortened. If the travel stroke is shortened, the time used for one loading or one unloading is shortened. As a result, loading or unloading of articles can be performed a larger number of times.

When the carrier is detected by the photoelectric sensor s1, the output L0 of the counter 33 at this time point is latched, and based on the difference from the latched value L0, the hand 28 is controlled. Therefore, in every loading motion, the trajectory of the hand does not change. Likewise, in every unloading motion, the trajectory of the hand does not change. Therefore, the hand can be controlled easily.

Before elevating or lowering the hand 28, the carrier is detected by the photoelectric sensor S2. At this time, the error in the encoder enc is checked, and the position of the hand is checked using the encoders 43, 44 of the motors to drive the hand. Therefore, if there is an error (difference) that is greater than a predetermined value in any of the encoder enc and hand 28, loading or unloading can be cancelled immediately before the operation.

When a moving distance of the carrier from detection of the carrier by the photoelectric sensor S2 reaches a predetermined moving distance, the hand starts to be elevated or lowered. This moving distance is common to both of loading and unloading. Therefore, loading of the article and unloading of the article by elevating or lowering the hand can be performed in substantially the same area.

When the carrier is detected by the photoelectric sensor s2, the position of the hand in the Y direction at this time point is determined to check whether the hand is positioned at the photoelectric sensor s2. As a result, it can be checked whether the hand is operated properly or not, and whether the hand and the carrier are present at the same position in the Y direction.

At the position of the photoelectric sensor s2, since it is checked whether the carrier and the hand are present at the same position and moving at the same velocity, matching of both of the position and the velocity in the Y direction can be confirmed.

Wide allowable ranges can be adopted for the change in the velocity of the endless belt 4, and the change in the velocity of the carrier. That is, the carrier is detected twice by the photoelectric sensors S1, S2. The moving distance of the endless belt 4 determined by the encoder enc in this period is compared with the distance between the photoelectric sensors S1, S2 in order to confirm whether the encoder enc is normal or not. The subsequent control of the hand can be carried out based on the data of the encoder enc. Thus, even if the velocity of the endless belt 4 changes, influences due to the change can be reduced and prevented.

In the present preferred embodiment, although the photoelectric sensors S1, S2 of a through-beam type are preferably used as the carrier sensors, the type of sensors and measurement principle can be adopted freely. When the carrier passes through the position of the photoelectric sensor s2, if there is any error having a value within an allowable range on the belt side, the control of the hand may be modified to compensate for the error. If there is any error having a value within the allowable range on the hand side, for example, control of the hand is changed to eliminate the error.

DESCRIPTION OF REFERENCE NUMERALS

2: transport system
4: endless belt
6, 6a, 6b: pulley
8: station
10: processing tool
12: carrier
14: cassette
20: manufacturing execution controller
22: material handling controller
24: endless belt driver
26: station controller
27: hand driver
28: hand
29R, 29L: occupation sensor
31, 32: shaping circuit
33: counter
34: carrier counter
35: comparator
36: latch
37: adder
38: comparator
40: encoder checker
41: parameter memory
42: communication I/F
43 to 45: encoder
46: driving motor
48, 48f, 48r: attachment
49: supporting surface
50: flange
51: carrier body
52: column
54: guide groove
56: elevating and lowering rail
58: hand base
59: wheel
60: watching line
70: baseline to 73: detection signal
80, 90: carrier
91, 92: attachment
94: optical mark
S1, s2: photoelectric sensor
enc: encoder
M1 to M3: motor
P1 to P7: parameter
K0 to K2: parameter While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport system comprising:
an endless driving medium configured to rotate in a circulating manner;
a plurality of carriers attached to the endless driving medium and configured to hold articles for transportation;
a plurality of stations provided along the endless driving medium; and
a moving distance sensor configured to measure a moving distance of the endless driving medium; wherein
each of the plurality of stations includes:
a hand configured to load articles to or unload articles from the carriers;
a driver configured to move the hand in a rotation direction of the endless driving medium and to move the hand in a vertical direction;
a first carrier sensor configured to detect the carrier at a predetermined position upstream of the hand along the rotation direction of the endless driving medium; and
a signal processor programmed to activate the hand via the driver based on a moving distance measured by the moving distance sensor, from a time point of detection of the carrier by the first carrier sensor; wherein
the signal processor is programmed to activate the hand via the driver at a first acceleration to load an article from the hand to the carrier when the moving distance measured by the moving distance sensor reaches a first moving distance, and the signal processor is programmed to activate the hand via the driver at a second acceleration larger than the first acceleration to unload an article from the carrier to the hand when the moving distance measured by the moving distance sensor reaches a second moving distance larger than the first moving distance.

2. The transport system according to claim 1, wherein each of the plurality of stations further comprises a second carrier sensor, the second carrier sensor being provided on a downstream side of the first carrier sensor in the rotation direction of the endless driving medium at a distance larger than the second moving distance;
upon the detection by the second carrier sensor of the carrier, the signal processor compares the moving distance measured by the moving distance sensor at a time point of detection of the carrier by the first carrier sensor with the distance larger than the second moving distance, and if a difference between the moving distance measured by the moving distance sensor at a time point of detection of the carrier by the first carrier sensor and the distance larger than the second moving distance is greater than a predetermined value, the signal processor stops movement of the hand via the driver.

3. The transport system according to claim 2, wherein at the moving distance measured by the moving distance sensor at a time point of detection of the carrier by the second carrier sensor reaching a third moving distance common to both of a case of loading the article from the hand to the carrier and a case of unloading the article from the carrier to the hand, the signal processor starts an elevating motion or a lowering motion of the hand via the driver.

4. A method for loading and unloading articles in a transport system, the method comprising the steps of:
attaching a plurality of carriers to an endless driving medium configured to rotate in a circulating manner, the carriers being configured to hold articles for transportation;
providing a moving distance sensor configured to measure a moving distance of the endless driving medium; and
providing at each of a plurality of stations along the endless driving medium:
a hand configured to load articles to or unload articles from the carriers;
a driver configured to move the hand in a rotation direction of the endless driving medium, and move the hand in a vertical direction;
a first carrier sensor configured to detect the carrier at a predetermined position upstream of the hand along the rotation direction of the endless driving medium; and
a signal processor programmed to operate the hand based on a signal from the first carrier sensor; wherein
the signal processor is programmed to activate the hand via the driver at a first acceleration to load an article from the hand to the carrier when the moving distance measured by the moving distance sensor reaches a first moving distance, and the signal processor is programmed to activate the hand via the driver at a second acceleration larger than the first acceleration to unload an article from the carrier to the hand when the moving distance measured by the moving distance sensor reaches a second moving distance larger than the first moving distance.

* * * * *